May 23, 1967

JAMES E. WEBB

ADMINISTRATOR OF THE NATIONAL AERONAUTICS AND SPACE ADMINISTRATION 3,321,570

PRINTED CIRCUIT BOARD WITH BELLOWS RIVET CONNECTION

Filed Jan. 19, 1966

INVENTOR.
CLARENCE W. GOULD

BY David E. Leslie
G. T. McCoy
ATTORNEYS

United States Patent Office 3,321,570

Patented May 23, 1967

3,321,570

PRINTED CIRCUIT BOARD WITH BELLOWS RIVET CONNECTION

James E. Webb, Administrator of the National Aeronautics and Space Administration, with respect to an invention of Clarence W. Gould, San Gabriel, Calif.

Filed Jan. 19, 1966, Ser. No. 521,753
8 Claims. (Cl. 174—68.5)

ABSTRACT OF THE DISCLOSURE

This invention provides a connection between printed circuits on printed circuit board consisting of a bellows rivet movably fitted within a hole through the opposite side of a printed circuit board which has means at each end for connecting to each printed circuit on each side of the board.

This invention relates to a bellows rivet and more particularly to a rivet connection for a printed circuit which connects circuits from opposite sides of a board.

In the field of electronics, the advent of printed circuits has revolutionized the industry. In this type of circuit, wiring is printed on a board to connect the leads of circuit components. In recent years, it has been found advantageous to have printed circuits on opposite sides of a common board. It is therefore necessary that some means be provided to connect the leads of the printed circuits on one side of the board to the leads of the circuit on the opposite side of the board. Typically, these leads comprise a rivet which is electrically conductive and which is placed in a bore in the board and connected to the desirable printed circuits on one side of the board to the other side of the board.

A printed circuit connection for connecting the circuits from one side of the board to the other side is disclosed and claimed in the U.S. patent to Little et al., No. 2,902,-629. This patent utilizes the dipped soldering connection method with an improvement thereover for connecting the opposite board circuit.

Another connecting means for printed circuits is disclosed in the U.S. patent to Berger, No. 2,889,393.

In the prior art, however, there are problems in connecting the circuits from one side of a printed circuit board to the circuits on the opposite side thereof due to vibration and thermal effects encountered during use. This is particularly a critical problem in the aerospace industry since these boards are subject to severe vibrations which tend to break the soldered connection due to the rigid nature of the connection between the two circuits. Due to these vibrations and high temperatures to which these boards are subjected, the soldered connections to the connector breaks, leaving a poor or even an intermittent electrical connection.

This invention in its most brief aspects provides an electrical connection between the circuits on opposite sides of a common board by relieving the axial and/or the transverse stresses imposed on the connection. This is done by allowing the connection to expand and contract by employing a bellows principle in the connection rivet.

It is therefore an object of this invention to provide an improved electrical connection between the circuits on opposite sides of a printed circuit board.

Other objects and advantages of this invention will become apparent as this description proceeds taken in conjunction with the drawings in which.

Figure 1:
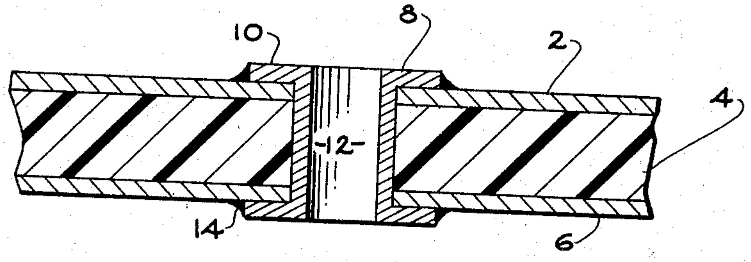
FIG. 1 PRIOR ART
FIGURE 1 is a view in cross section of a printed circuit board having thereon a printed circuit with the typical rivet connection shown in the prior art.

Referring now to FIGURE 1, there is shown a conventional rivet connection for printed circuits on opposite sides of a common board. Thus, designated at 2 is a printed circuit on one side of board 4 and a printed circuit 6 on the other side of board 4. Since it is desirable to provide an electrical connection between these printed circuits, a common method is to provide a rivet 8 which has flanges thereon such as shown at 10. This rivet is fitted within a bore 12 of board 4 and soldered such as shown at 14 to the respective printed circuits. This type of construction, however, suffers a disadvantage when the device is subjected to vibration which tends to loosen the soldered connection thus providing a poor or even intermittent electrical connection between printed circuit 2 and printed circuit 6.

Figure 2:
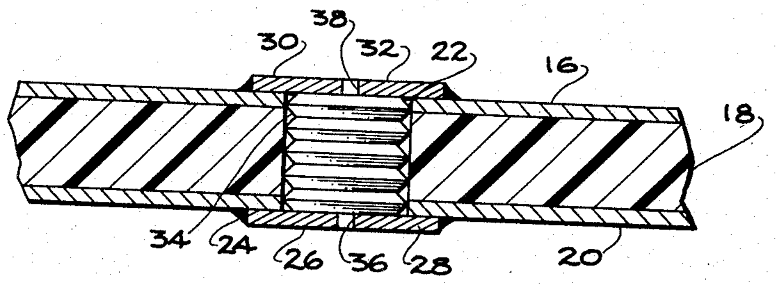
FIGURE 2 is a view in cross section of one embodiment of this invention.

FIGURE 2 is illustrative of one embodiment of this invention. Similar to the structure shown in FIGURE 1, is a printed circuit 16, a board 18 and another printed circuit 20. A bore 22 is provided in board 18. Soldered, for example, at 24 is a flange 26 and in similar manner flanges 28, 30 and 32 are provided, all of which are soldered to their respective portions of the printed circuit. Mounted between the flanges on circuit 20 and the flanges on circuit 16 is a bellows 34. This bellows is expandable in the axial direction and is free to shift transversely so that vibration imparted to the board will be taken up by the bellows 34. This bellows is metallic and is free to conduct electricity from circuits 16 to circuit 20 and vice versa. Bellows 34 is attached to the flanges as by soldering such as shown at 36 and 38.

Figure 3:
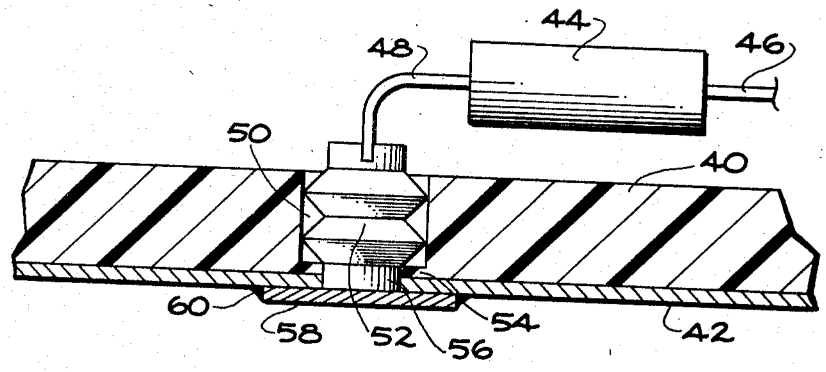
FIGURE 3 is a view in cross section of another embodiment of this invention.

FIGURE 3 is illustrative of another embodiment of this invention. A board 40 has on one side thereof a printed circuit 42 and a component 44 on the other side such as a diode. Diode 44 has leading therefrom leads 46 and 48. In this particular case it is desirable to have lead 48 electrically connected to printed circuit 42. This is accomplished by providing a bore 50 in board 40 and a bellows 52 provided to fit within the bore. Printed circuit board 40 has a shoulder 54 thereon so as to form a narrow portion of the bore. Bellows 52 has an extension or an axially extending portion 56 which fits tightly within the bore 50 against shoulder 54. Attached to the axially extending portion as by soldering or the like is a flange 58 which is soldered such as at 60 to printed circuit 42. In this particular embodiment, the rivet is so mounted such as to relieve both axial and transverse stresses in an expeditious manner. This relieves stresses on such fragile components as diodes 44.

The rivet can be formed by any convenient means such as an electro-deposition process or by a drawing and pressure forming process. In any event, the method of forming the bellows of the embodiment of FIGURE 2 or FIGURE 3 forms no part of this invention.

Thus, it can be seen that by this invention an electrical connection is provided between one side of a circuit board and another side thereof which relieves stresses induced by such means as thermal stresses or vibration stresses or simple static stresses in the printed circuit board.

Having decribed this invention, it is to be understood that it is to be limited only by the scope of the claims appended hereto.

What is claimed is:

1. In an electronic printed circuit board wherein printed circuits are provided on both sides of said board with conductors interconnecting said circuits, the improvement which comprises:

- a first electrical connector connected to the circuit on a first side of said board;
- a second electrical connector connected to the circuit on the other side of said board;

a bore extending through said board from said first connector to said second connector; and an electrically conductive bellows mounted in said bore, said bellows being in electrical contact with each of said connectors;

whereby stresses on electrical connections between said circuits are absorbed by said bellows.

2. In an electronic printed circuit board according to claim 1 wherein at least one of said electrical connectors comprises a flange, said flange being soldered to one of said circuits and to said bellows.

3. In an electronic printed circuit according to claim 2 wherein the other of said electrical connectors comprises a flange soldered to the other of said circuits and to said bellows.

4. In an electronic printed circuit board according to claim 1 wherein one end of said bore is narrowed, said bellows having at one end thereof an axially extending portion tightly fitted within said narrowed portion of said bore.

5. In an electronic printed circuit according to claim 4 wherein said first electrical connector is a flange, said axially extending portion is in electrical contact with said flange.

6. In an electronic printed circuit according to claim 5 wherein said second electrical connector is a lead of an electrical component, and means at said other end of said bellows for attaching said lead on said other end of said bellows.

7. In an electronic printed circuit according to claim 6 wherein said bellows is loosely mounted within said bore.

8. In an electronic printed circuit board of the type having a printed circuit on each side of said board, and a hole bored through said board for enabling the interconnection of said circuits, the improvement in means for interconnecting said circuits comprising:

an electrically conductive bellows movably fitted within said hole and extending from one side thereof to the other; and means at each end of said bellows for electrically connecting each end of said bellows to the respective printed circuits on each side of said printed circuit board.

References Cited by the Examiner

UNITED STATES PATENTS 3,065,293 11/1962 Overman ------------ 174—88
3,268,652 8/1966 Burns et al. ---------- 174—68

References Cited by the Applicant

UNITED STATES PATENTS 2,889,393 6/1959 Berger.
2,902,629 9/1959 Little.

LEWIS H. MYERS, *Primary Examiner.*

D. L. CLAY, *Examiner.*